(12) United States Patent
Kaite et al.

(10) Patent No.: US 6,501,247 B2
(45) Date of Patent: Dec. 31, 2002

(54) METHOD OF DISPLAYING FULL-CHARGE-STATE

(75) Inventors: Osamu Kaite, Tsuna-gun (JP); Toshiharu Kokuga, Tsuna-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/769,502

(22) Filed: Jan. 26, 2001

(65) Prior Publication Data

US 2001/0017533 A1 Aug. 30, 2001

(30) Foreign Application Priority Data

Jan. 27, 2000 (JP) ........................................ 2000-018233

(51) Int. Cl.[7] ................................................ H02J 12/00
(52) U.S. Cl. ..................................................... 320/133
(58) Field of Search ................................. 320/132–136

(56) References Cited

U.S. PATENT DOCUMENTS

| 4,258,306 A | * | 3/1981 | Bourke et al. | 320/134 |
| 4,371,827 A | | 2/1983 | Mullersman et al. | 320/112 |
| 4,560,915 A | * | 12/1985 | Soultanian | 320/133 |
| 4,692,682 A | | 9/1987 | Lane et al. | 320/152 |
| 4,740,754 A | * | 4/1988 | Finger | 320/DIG. 21 |
| 5,013,993 A | * | 5/1991 | Bhagwat et al. | 320/150 |
| 5,289,102 A | | 2/1994 | Toya | 320/148 |
| 5,480,734 A | * | 1/1996 | Schulz et al. | 429/7 |
| 5,642,031 A | * | 6/1997 | Brotto | 320/161 |
| 5,708,350 A | * | 1/1998 | Tibbs | 320/153 |
| 5,767,659 A | * | 6/1998 | Farley | 320/150 |
| 6,236,214 B1 | * | 5/2001 | Camp, Jr. et al. | 320/132 |

* cited by examiner

*Primary Examiner*—Edward H. Tso
*Assistant Examiner*—Pia Tibbits
(74) *Attorney, Agent, or Firm*—Wenderoth, Lind & Ponack, L.L.P.

(57) ABSTRACT

A method of displaying the full-charge-state of a battery according to the invention is characterized in that the displaying is retarded by a predetermined period of time after the full-charge-state is detected. According to the method, the delay time is so determined that the battery which requires a shorter charging time needed to full-charge the battery has a longer delay time period than the battery requiring a longer charging time.

22 Claims, 5 Drawing Sheets

METHOD OF DISPLAYING FULL-CHARGE-STATE

This application is based on application No. 018233 filed in Japan on Jan. 27, 2000, the content of which incorporated hereinto by reference.

BACKGROUND OF THE INVENTION

The present invention relates to a method of displaying the full-charge-state of a rechargeable battery, and more specifically to a method of displaying the-full-charge-state not at the time when the battery is fully charged but a predetermined period of time later from the full-charge-state.

As a battery undergoes charging, the battery temperature rises. The battery temperature rises as charging operation comes closer to completion, and it rises sharply after the full-charge-state is reached because the charging current is consumed as heat loss heating the battery after the full charge state.

FIG. 1 is a graph depicting how the temperature rises during charging. As shown in the figure, the battery temperature continues to rise after charging current is shut off when the full charge is reached. The phenomenon is caused by the fact that heat transfer from inner portion to the outer portion of the battery requires a certain period of time. Since the surface temperature of a battery continues to rise as shown in FIG. 1 even after the full charge-state is reached, the battery user often finds the battery too hot when he removes the battery from the battery charger following the full charge sign given at the time of full-charge. The surface temperature becomes especially high in case of fast charging where stronger charging currents are supplied. The standardized battery such as U1–U4 battery which has a metal casing with no outer cover or a thin layer of covering is easier to get higher surface temperature. The drawback of the battery charger making the battery user uncomfortable from excessive heat is eliminated by a method of displaying the full-charge-state after a delay time, i.e. displaying the full-charge-state a predetermined time after the battery is fully charged.

The longer the delay time, the lower the surface temperature at the time when full charge display appears. However, since the method retards the display of full charge, it is not capable of quickly displaying the full-charge-state for the user. The drawback will be eliminated by using a shorter delay time period. However, as the delay time period is shortened, the battery surface temperature increases, making the user feel uncomfortable when handling the battery.

Thus, protecting the user from excessive heat of the battery conflicts with quickly displaying of a full-charge-state.

The present invention has been completed as a result of intensive study conducted by the inventors about how battery, temperature rises after the full charge is reached. The present invention is based on the fact that the rate of temperature rise varies depending on the charging process. Therefore, the main objective of the present invention is to provide a method of displaying full charge state of a battery while keeping the battery temperature low.

The above and further objectives and features of the invention will more fully be apparent from the following detailed description with accompanying drawings.

SUMMARY OF THE INVENTION

The method of the present invention of displaying the full charge involves displaying the full-charge-state with a delay time period after the full-charge-state is detected. The method of the present invention of displaying full-charge-state resides in that in displaying the full-charge-state, a longer delay time period is selected for a rechargeable battery which has been charged with a shorter charging time.

According to the above-mentioned method of displaying the full-charge-state, full charge display can be performed with optimum delay time for the battery being charged, while the battery temperature is kept low. The method of the present invention of displaying the full charge involves displaying the full-charge-state with a longer delay time after the full-charge-state is detected for a battery having a shorter charging time which has a higher temperature rise on one hand, and displaying the full-charge-state with a shorter delay time for a battery having a longer charging time which has a lower temperature rise after the full-charge on the other hand.

According to the present method, the full-charge-state is displayed with a longer delay time for a battery having a shorter charging time, without causing substantial inconveniences to the use of the battery because the delay time is negligible as compared with the charging time. On the other hand, for the battery which requires a longer charging time, fill charge is displayed with a shorter delay time, thus enabling quick display of the full-charge-state after the full charge is detected.

The method of present invention of displaying the full-charge-state employs the delay time as a function of the charging time.

The method of the present invention of displaying the full-charge-state is preferably employed for charging Ni—Cd or Ni—MH batteries.

The method of the present invention of displaying the full-charge-state employs a charging current of 0.5–4C.

DETAILED DESCRIPTION OF THE INVENTION

Figure 1:
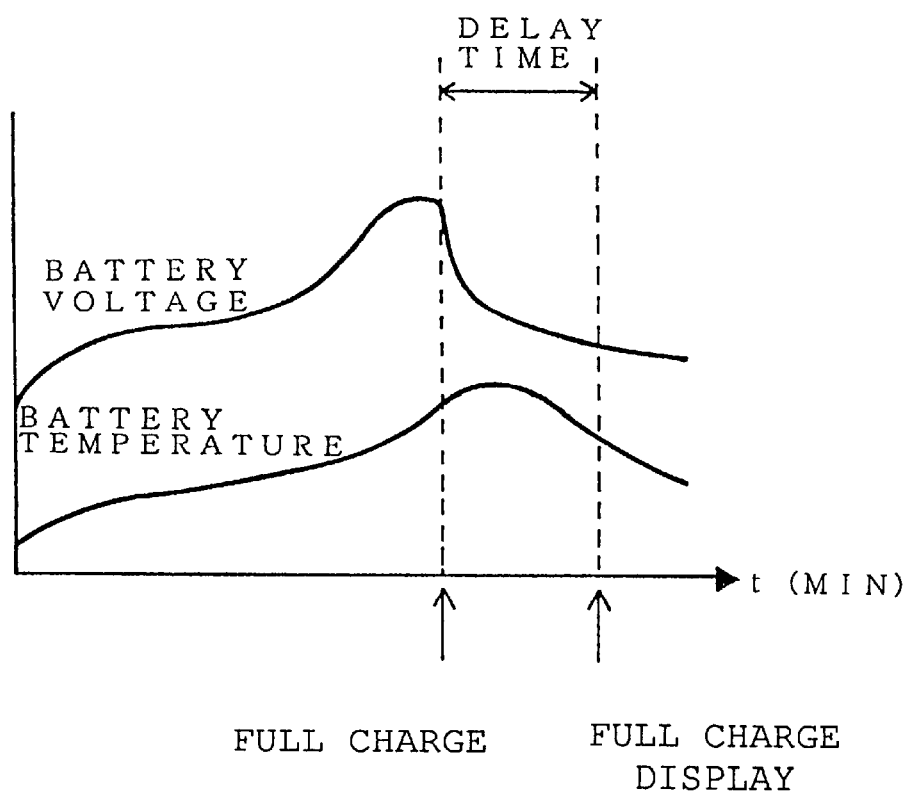
FIG. 1 is a graph depicting the relationship between battery voltage and battery temperature.
Figure 2:
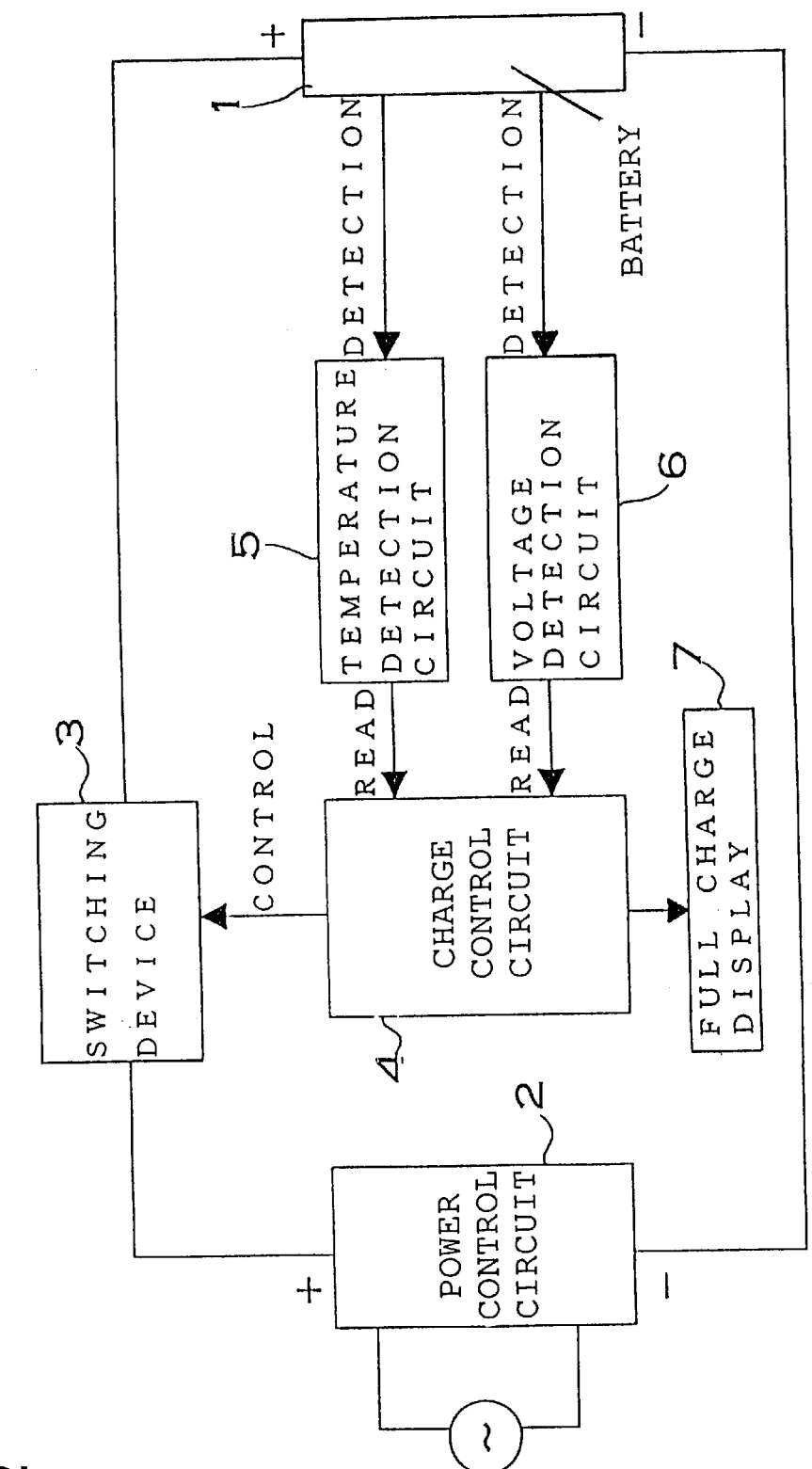
FIG. 2 is a schematic diagram of the battery charger for performing an embodiment of the method of the present invention.

FIG. 2 is a schematic diagram of the battery charger employing the method of displaying full charge according the present invention. The battery charger is for charging a secondary battery such as a Ni—Cd or a Ni—MH battery or lithium ion battery. The battery charger includes a power source circuit 2, a switching device 3 such as a switching circuit, for connecting or disconnecting the power source circuit 2 to a battery 1, a charge control circuit 4 for controlling the switching device 3, a temperature sensing circuit 5 for detecting battery temperature and inputting the signals to the charge control circuit 4, a voltage detecting circuit 6 for detecting voltage signals and inputting the signals to the charge control circuit 4, and a display for displaying the full-charge-state.

The power source circuit 2 supplies current and voltage to the battery. In the case where a Ni—Cd battery or a Ni—MH battery is to be charged, the power source 2 supplies the charging current of e.g. 0.5–4 C, preferably 1–3 C, or more preferably 1–2 C for fast-charging.

The power source circuit 2 constitutes a switching power source. The switching power source includes a rectifying circuit which rectifies the commercial AC 100V current, a switching circuit for switching the direct current supplied by the rectifying circuit, a transformer for lowering the voltage of alternating currents to a charging voltage of the battery which are generated by the switching circuit and supplied to the primary coil, a second rectifier comprising a diode for rectifying the charging current, a CV/CC control circuit for controlling the duty factor of the switching circuit in response to the output voltage of the rectifier and to signals from the controller, and an insulating PC circuit. The power source does not necessary comprises a switching power source. The power source circuit may comprise a circuit capable of lowering the voltage of 100 V alternating currents and rectifying the currents to a lowered voltage and stabilizing the direct current.

The switching device 3 constitutes a semi-conductor switching device such as a transistor, for example a FET. The switching device 3 turns on to supply a charging current to the battery and turns off to stop supplying the current when the battery is fully charged.

The charge control circuit 4 turns on the switching device 3 to initiate charging. It turns off the switching device 3 to stop charging when the battery is fully charged. The charge control circuit 4 sends the full-charge signal to the full charge display 7 with a delay time period after the switching device has been turned off.

The charge control circuit 4 determines the full-charge-state by detecting the battery voltage that is input from the voltage detecting circuit 6. The charge control circuit 4 determines the full-charge-state in various manners depending on the battery type of battery 1. In the case where a Ni—Cd or a Ni—MH battery is to be charged, the full-charge-state is determined on the basis of the peak voltage or decrease DELTA V in the battery voltage from the peak voltage. In the case where lithium ion battery is to be charged, the full-charge-state is determined on the basis of the predetermined battery voltage.

The charge control circuit 4 keeps in memory the delay time period by which time after the full charge, the full-charge-state is displayed on the display 7. The delay time period has various values corresponding to the time period required for the battery to be fully charged. A longer time period is preselected for a battery which requires a shorter time period to be fully charged.

Figure 3:
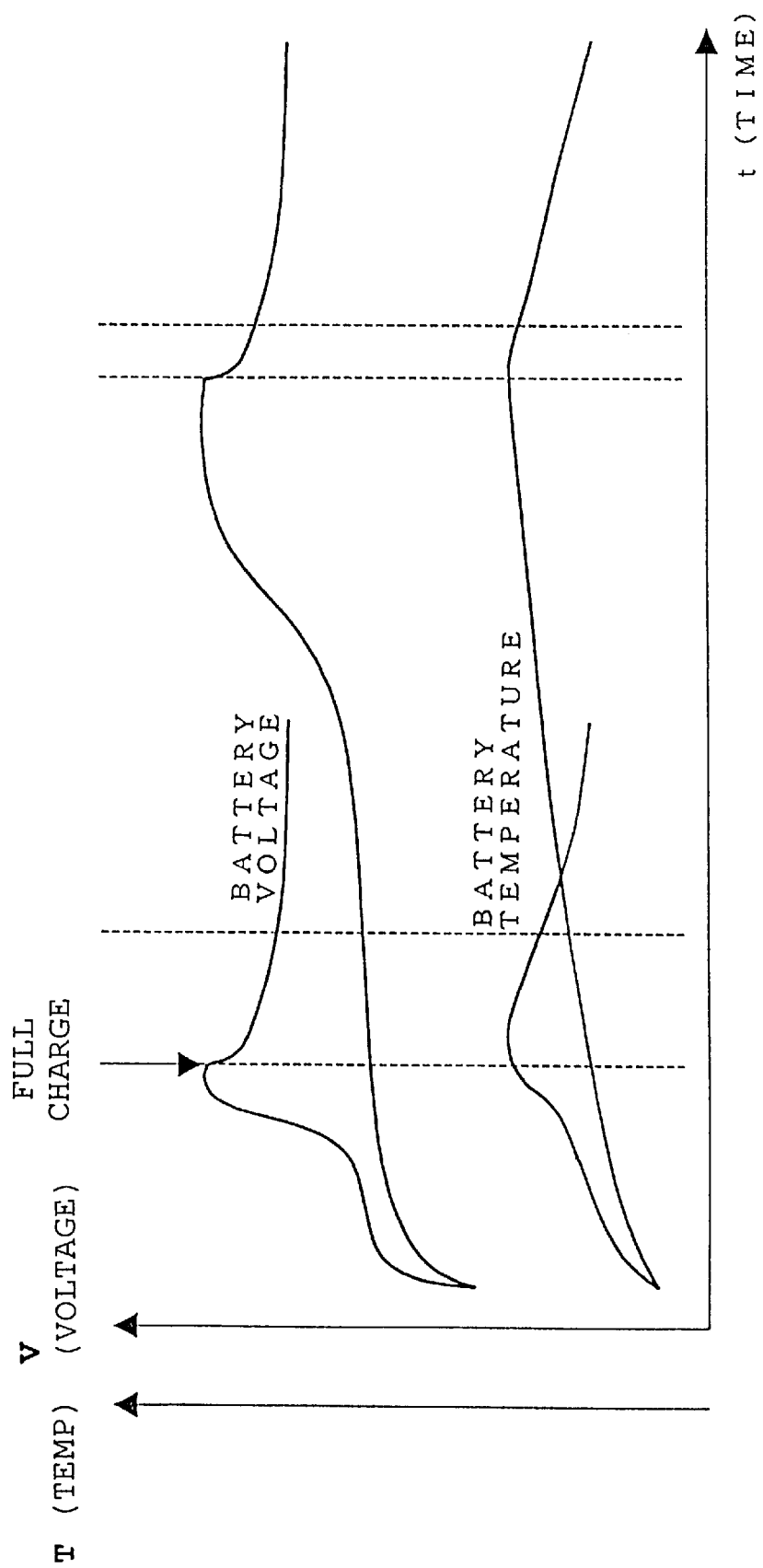
FIG. 3 is a graph depicting the relationship between the battery temperature and battery voltage.

FIG. 3 is a graph depicting the relationship between the battery temperature and the battery voltage. The figure also shows the voltage characteristic curve or temperature characteristic curve of a Ni—Cd or a Ni—MH battery. As shown in the figure, the battery voltage reaches a peak value as the battery is fully charged. The voltage decreases by DELTA V from the peak as charging continues. After the charge control circuit 4 has determined the full-charge-state on the basis of the peak voltage or the decrease in the voltage by DELTA V from the peak, it turns the switching device 3 off to stop charging.

After the charging current has been shut off, the battery temperature continues to rise (overshooting). The battery requiring a shorter charging time, i.e. a battery with a greater residual power, which is close to the full-charge-state, shows a higher temperature than the one requiring a longer charging time, namely the one having a smaller residual power. In use, the charger may sometimes be loaded with a battery in full-charge-state. The battery has a greater remaining power and shows a sharp temperature rise.

Figure 4:
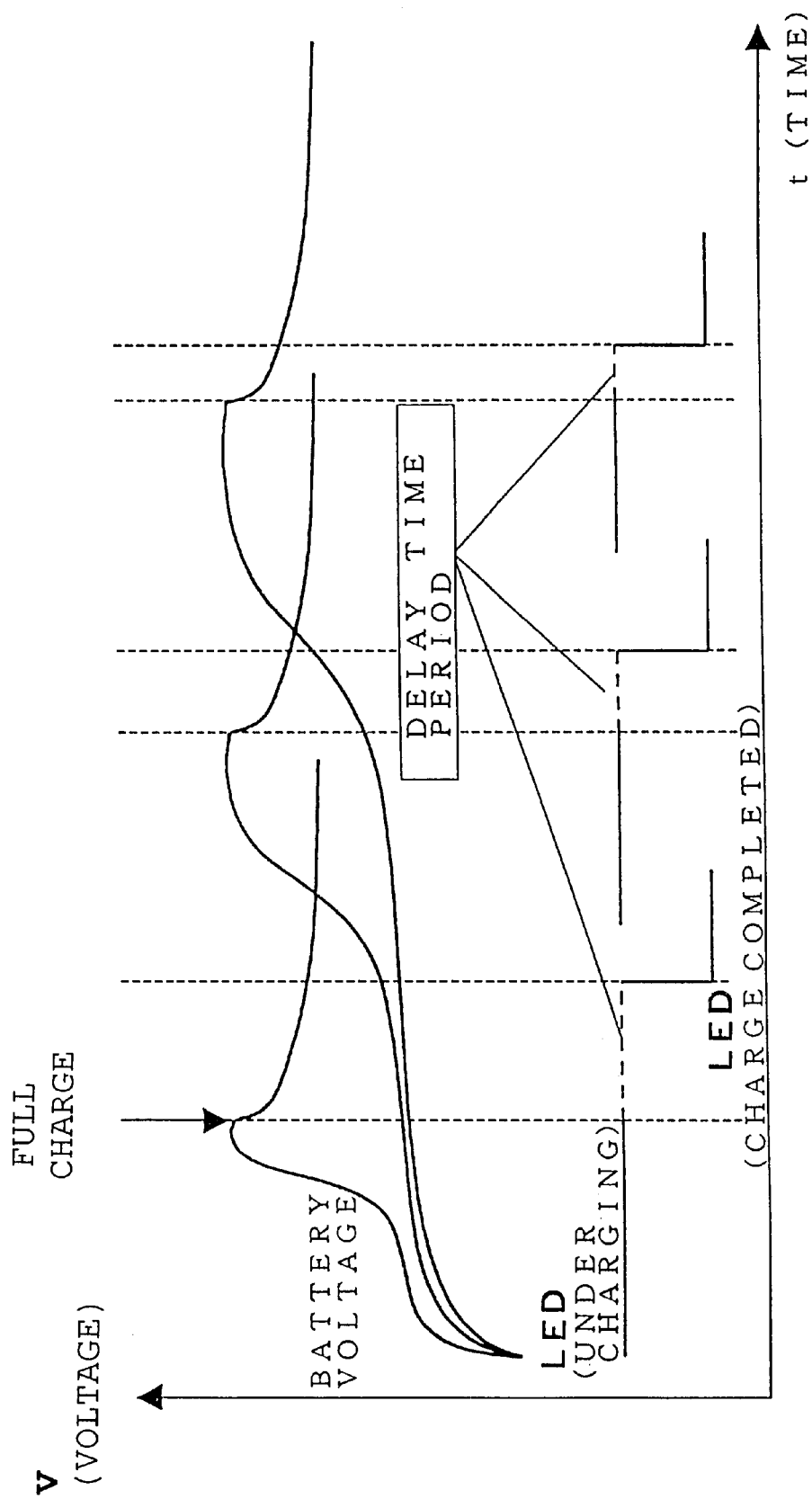
FIG. 4 is a graph depicting the relationship between charging time and delay time according to the present invention.

As shown in FIG. 4, the charge control circuit 4 has a varying delay time depending on the charging time. For a battery having a shorter charging time, a longer delay time is preselected since the battery shows a higher temperature after it has been fully charged. On the contrary, for a battery having a longer charging time, a shorter delay time is preselected since the battery shows relatively low temperature after it has been fully charged.

Figure 5:
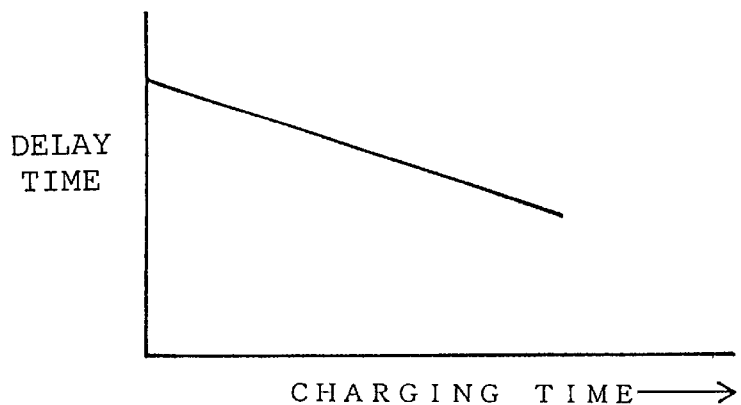
FIG. 5 is a graph depicting an example of the relationship between the delay time and the charging time.
Figure 6:
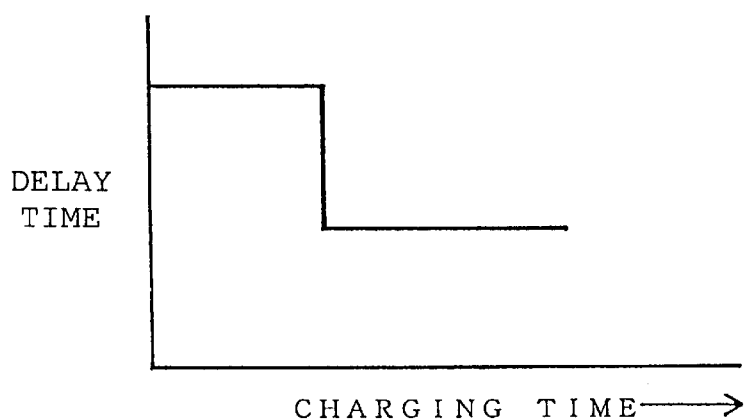
FIG. 6 is a graph depicting another example of relationship between delay time and charge time.
Figure 7:
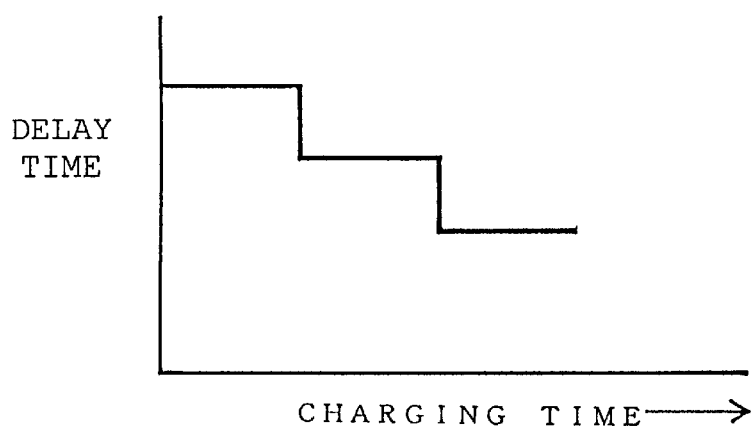
FIG. 7 is a graph depicting yet another example of relationship between the delay time and charge time.

FIGS. 5–7 show how the charge control circuit varies the delay time period in relation to the charging time. FIG. 5 shows the delay time period as a function of the charging time. In the figure, the delay time period is shown as a linear function in relation to the charging time. The delay time period is not limited to a linear function but it may be other types of functions. FIG. 6 shows the delay time period having binary states in relation to the charging time, a longer delay time for the charging time shorter than a predetermined value but a shorter delay time for the charging time longer than the predetermined value. FIG. 7 depicts a stepwise reduction of the delay time in relation to the charging time. According to the method of determining the delay time as shown in FIGS. 5 and 7, it is possible to perform an optimum display of the full-charge-state of batteries having varying residual power. The method of determining the delay time period shown in FIG. 6 enables to display the full-charge-state with a simple circuitry. The function which defines the relationship between the delay time period and the charging time as shown in FIG. 5 through 7 is stored in a memory circuit of the charge control circuit 4 (not shown in the drawings).

The charge control circuit 4, upon detection of the full-charge-state, turns off the switching device 3, and then, upon expiration of the delay time period in the memory, sends a full-charge signal to the full charge display 7. When the full charge signal has been input, the full charge display 7 turns on LEDs or changes the light color of LEDs or turns LEDs on and off or posts letters showing the full charge on its panel.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A method of displaying a full-charge-state of a battery comprising:

charging a battery for a full charge time period required to charge the battery to a full-charge-state;

detecting the full-charge-state of the battery; and displaying the full-charge-state of the battery after a delay time period, wherein the delay time period is based on the full charge time period.

2. The method of claim 1, wherein the delay time period is a linear function of the full charge time period.

3. The method of claim 1, wherein the delay time period comprises a first time period when the full charge time period is longer than a predetermined time period, and wherein the delay time period comprises a second time period when the full charge time period is equal to or shorter than the predetermined time period.

4. The method of claim 3, wherein the first time period is shorter than the second time period.

5. The method of claim 1, wherein the delay time period is a discrete function of the full charge time period.

6. The method of claim 1, wherein the battery comprises a Ni—Cd battery.

7. The method of claim 1, wherein the battery comprises a Ni—MH battery.

8. The method of claim 1, wherein the battery comprises a lithium-ion battery.

9. The method of claim 1, wherein said charging comprises charging with a current having 0.5–4 C of strength.

10. The method of claim 1, wherein said charging comprises charging with a current having 1–3 C of strength.

11. The method of claim 1, wherein said charging comprises charging with a current having 1–2 C of strength.

12. A method of displaying a full-charge-state of a battery comprising:

charging a battery for a full charge time period required to charge the battery to a full-charge-state;

detecting the full-charge-state of the battery; and displaying the full-charge-state of the battery after a delay time period, wherein the delay time period is a first delay time period when the full charge time period is a first full charge time period, and wherein the delay time period is a second delay time period when the full charge time period is a second full charge time period.

13. The method of claim 12, wherein the delay time period is a linear function of the full charge time period.

14. The method of claim 12, wherein the first delay time period is longer than the second delay time period, and wherein the first full charge time period is shorter than the second full charge time period.

15. The method of claim 12, wherein the full charge time period is a first full charge time period when the full charge time period is shorter than a predetermined time period, and wherein the full charge time period is a second full charge time period when the full charge time period is equal to or longer than the predetermined time period.

16. The method of claim 12, wherein the delay time period is a discrete function of the full charge time period.

17. The method of claim 12, wherein the battery comprises a Ni—CD battery.

18. The method of claim 12, wherein the battery comprises a Ni—MH battery.

19. The method of claim 12, wherein the battery comprises a lithium-ion battery.

20. The method of claim 12, wherein said charging comprises charging with a current having 0.5–4 C of strength.

21. The method of claim 12, wherein said charging comprises charging with a current having 1–3 C of strength.

22. The method of claim 12, wherein said charging comprises charging with a current having 1–2 C of strength.

* * * * *